Figure 1:
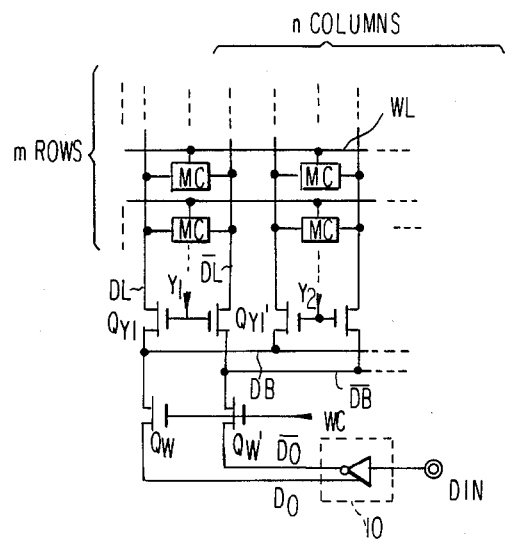

United States Patent [19]

Ozawa

[11] Patent Number: 4,573,145
[45] Date of Patent: Feb. 25, 1986

[54] SIGNAL TRANSMITTING CIRCUIT

[75] Inventor: Takashi Ozawa, Tokyo, Japan

[73] Assignee: NEC Corporation, Tokyo, Japan

[21] Appl. No.: 504,562

[22] Filed: Jun. 15, 1983

[30] Foreign Application Priority Data

Jun. 15, 1982 [JP] Japan .............................. 57-102618

[51] Int. Cl.⁴ .............................................. G11C 7/00
[52] U.S. Cl. .................................... 365/194; 365/233
[58] Field of Search ................ 365/194, 193, 190, 233

[56] References Cited

U.S. PATENT DOCUMENTS 3,566,097  2/1971  Hildebrandt ..................... 365/194 X Primary Examiner—Joseph A. Popek
Attorney, Agent, or Firm—Sughrue, Mion, Zinn, Macpeak & Seas

[57] ABSTRACT

A signal transmitting circuit which can transmit an input signal with a variable delay time is disclosed. The circuit comprises a series circuit of a transistor and a load element and a variable time constant circuit coupled to a control electrode of the transistor whose time constant value is changed in response to a control signal.

7 Claims, 8 Drawing Figures

SIGNAL TRANSMITTING CIRCUIT

The present invention relates to a signal transmitting circuit, and more particularly to a transmitting circuit for a data input signal to a memory.

As a circuit for amplifying and transmitting a signal, a circuit consisting of a plurality of inverters connected in cascade is used. The delay time of the signal transmission from the input to the output of such circuit is the total sum of the delay times of the individual ones of the cascaded inverters. Accordingly, an output signal can be derived after this total delay time, which is a constant, unvarying time. The delay time of each inverter is determined by its output load capacitance and capabilities of a load transistor and a drive transistor, and the output load capacitance is determined depending upon the capacitance of an output line connected to the gate of a drive transistor in the subsequent inverter and the gate capacitance of the drive transistor of the subsequent inverter.

Generally, a plurality of signal transmitting circuits are provided in an integrated circuit, and logic operations are carried out on the basis of a plurality of signals obtained through the respective signal transmitting circuits. For instance, an integrated memory circuit, receives a write control signal for controlling write operation mode of the memory and a data input signal to be written as well as address signals from the external, and the data input signal which has been temporarily stored in a buffer is written in a selected memory cell designated by the address signals via a write gate controlled by the write control signal. Consequently, a predetermined timing relation is required among the data input signal, address signals and the write control signal. More particularly, the response delay characteristic of the signal transmitting circuit for receiving the data input signal must be determined in such manner that the write control data can be surely activated during the period when address selection has been effected by the address signals and the memory is held in a write mode by the write control signal in the integrated memory circuit.

However, due to fluctuations in manufacture, it was difficult to obtain signal transmitting circuits having delay characteristics exactly fulfilling designed values with good reproducibility.

Furthermore, the signal transmitting circuit for the data input signal in the aforementioned type memory is desired, in order to effectively utilize a limited writable period within the memory, to achieve a hold effect for the data input signal by quickening response to a leading edge of an input signal, that is, by reducing a delay time, and on the other hand, by choosing a large delay time for a trailing edge of the input signal.

It is one object of the present invention to provide a signal transmitting circuit whose delay response characteristic can be made variable.

Another object of the present invention is to provide a signal transmitting circuit that is suitable as a data buffer for a memory.

The signal transmitting circuit according to the present invention is featured by providing a time constant circuit at least one location in a signal transmission path with a time constant of this time constant circuit varied by a control signal. The time constant circuit may include a transistor inserted serially in the signal transmission path with its conductivity being varied by a control signal and a capacitor coupled between an output side of this transistor and a fixed potential point. The time constant circuit may include a series circuit consisting of a transistor and a capacitor between the signal transmission path and a fixed potential point, the transistor being controlled by a control signal to selectively add the aforementioned capacitor to the signal transmission path.

According to the present invention, there is provided a logic integrated circuit operable in response to a plurality of input signals, in which a transmission time of one input signal in the logic circuit is controlled by an internal control signal generated within the logic circuit as synchronized with another input signal in such manner that the transmission time of one input signal can be varied by another input signal which generates the internal control signal.

According to the present invention, a signal transmitting circuit whose delay response characteristic is controlled by a control signal, can be easily realized. Therefore, by making use of such signal transmitting circuits, the functions of the logic circuits and information processors can be greatly improved and expanded.

Figure 2:
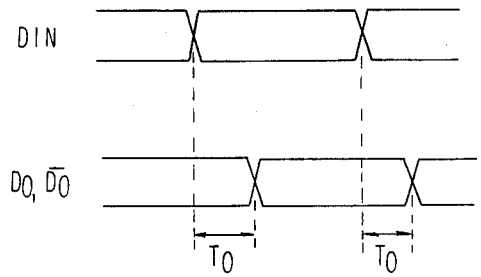
Figure 3:
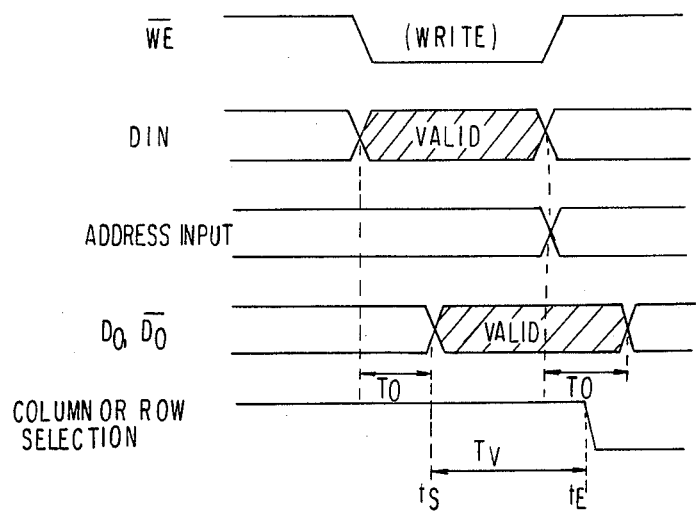
Figure 4:
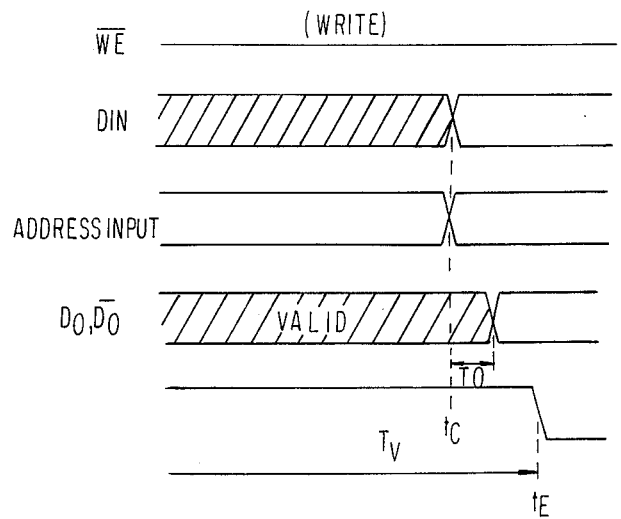
Figure 5:
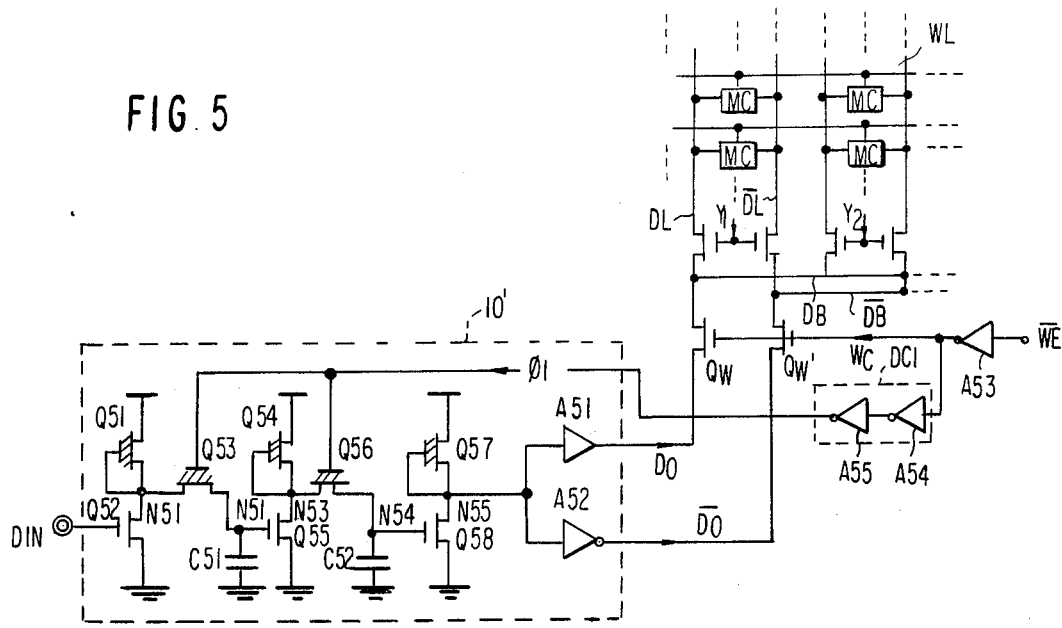
Figure 6:
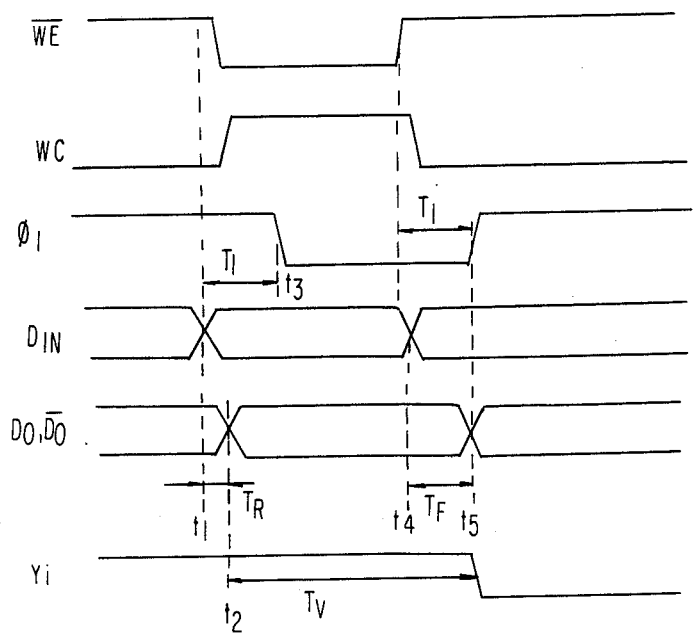
Figure 7:
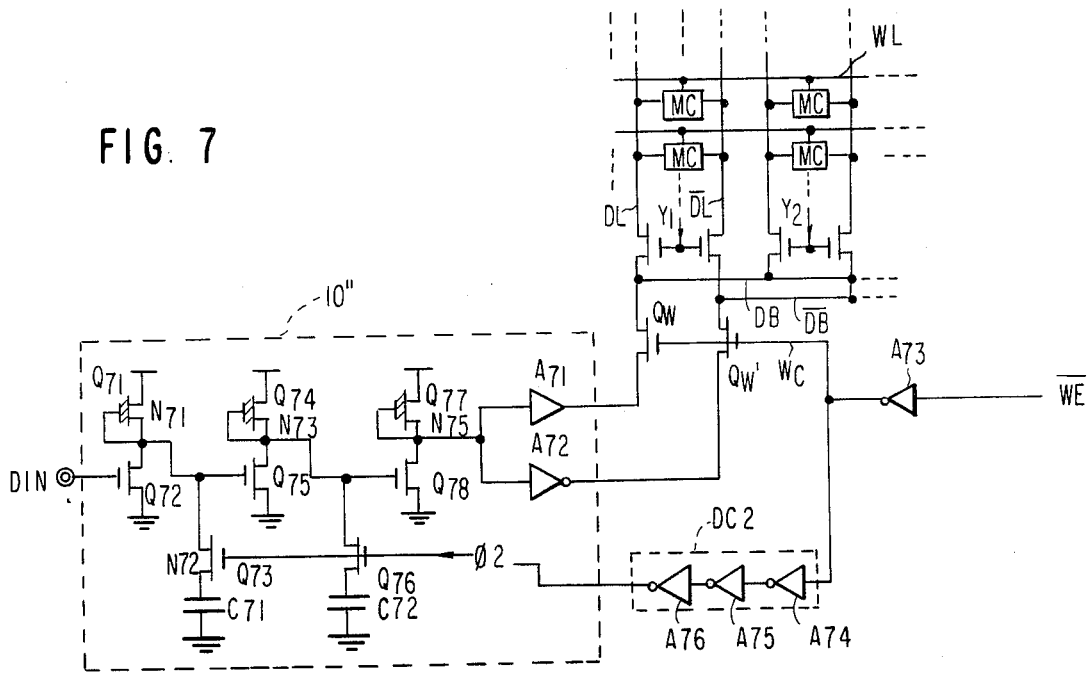
Figure 8:
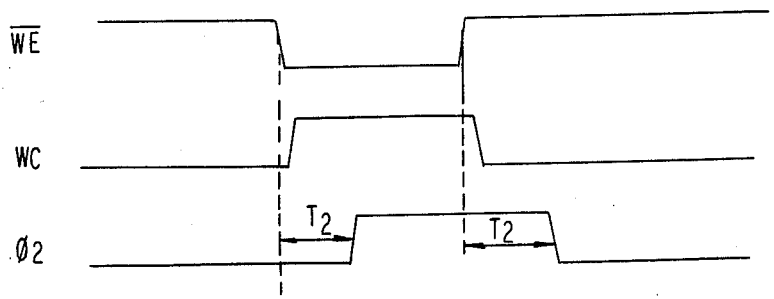

The above-mentioned and other objects, features and advantages of the present invention will become more apparent by reference to the following description of preferred embodiments of the invention taken in conjunction with the accompanying drawings, wherein, FIG. 1 is a schematic view showing a part of a write circuit of a static memory in the prior art, FIG. 2 is a diagram showing a timing selection between an input and an output in a DIN circuit, FIG. 3 shows one example of a write pattern which indicates an influence in the case where a DIN input propagation time $T_0$ is long, FIG. 4 shows another example of a write pattern which indicates an influence in the case where a DIN input propagation time $T_0$ is short, FIG. 5 is a circuit diagram showing one preferred embodiment of the present invention, FIG. 6 is a time chart showing the relation between a write signal $\overline{WE}$ and a signal $\phi_1$ in FIG. 5, FIG. 7 is a circuit diagram showing another preferred embodiment of the present invention, and FIG. 8 is a timing chart showing the relation between a write signal $\overline{WE}$ and a signal $\phi_2$ in FIG. 7.

Now description will be made on an essential part of a static memory in the prior art, with reference to FIG. 1.

Memory cells MC of flip-flop type are disposed at cross-points between n rows of word lines WL and n columns of digit line pairs (DL, $\overline{DL}$). Each digit line pair (DL, $\overline{DL}$) is connected to a data bus pair (DB, $\overline{DB}$) through a column selection transistor pair ($Q_{Y1}$, $Q_{Y1}'$) which operates in response to a column selection signal $Y_1$ or the like. To the pair of buses (DB, $\overline{DB}$) are applied true and complementary buffer outputs of a data circuit 10 which receives a data input DIN, through a pair of write gate transistors $Q_w$ and $Q_w'$, respectively. These write gate transistor $Q_w$ and $Q_w'$ are made conducting upon write operation by an internal write signal WC that is generated by the write signal WE. Upon write operation, the write switching MISFET's $Q_w$ and $Q_w'$ become conducting, and hence data corresponding to the DIN signal is written in the selected memory cell. On the other hand, upon read operation, since the write switching MISFET's $Q_W$ and $Q_w'$ do not become conducting, write to any memory cell is not effected.

In FIG. 2 is shown a relation between the signal DIN and the output signal of the circuit 10. Normally, the output of the DIN circuit 10 is drawn out as effective data having a time difference $T_0$ with respect to the input DIN to the same circuit. This time difference $T_0$ would cause inconvenience in the write operation of the memory either in the case where it is too long or in the case where it is too short.

FIG. 3 shows the case where a write enable signal $\overline{WE}$ is applied in a pulse form at a point $t_1$, and at the same time a write data signal DIN is made valid and address input signals are effective, and then the state transfers from a write state to a read state at a time point $t_2$. In the case where the $\overline{WE}$ signal is short as shown in FIG. 3 if the time difference $T_0$ is too long, then an effective write time $T_v$ to a selected memory cell that is dependent upon the effective output of the data circuit 10 becomes short, and in the worst case an inconvenience would occur that write operation is impossible. More particularly, since a time point $t_s$ when the output of the data circuit 10 becomes effective is delayed by a period $T_0$, the effectie wrie period $T_v$ between this time point $t_s$ and a time point $t_E$ when the column or row selection is finished, would be shortened.

On the other hand, the case where the time difference $T_0$ is too short will be explained with reference to FIG. 4.

FIG. 4 shows the case where a write state continues for a long time by a low level of $\overline{WE}$, and an address input signal and DIN have been switched simultaneously at a time point $t_c$. If the time difference $T_0$ is too short, then since the data circuit output is switched during the period when a write operation to a selected memory cell is still effective, that is, before the selection of the column or row is changed at a time point $t_E$, in the worst case there occurs an inconvenience that inverse input data is rewritten in the same memory cell, resulting in an erroneous write operation.

According to the present invention, there is provided a signal transmitting circuit in which the requirement in the prior art that the time difference $T_0$ must be regulated to an appropriate value, can be mitigated and hence a margin of DIN for write operation can be broadened.

According to the present invention, under a write condition introduced by a $\overline{WE}$ signal of a short pulse as shown in FIG. 3 the transmission time $T_0$ for the input signal DIN is made short, whereas under a long write condition as illustrated in FIG. 4 the transmission time $T_0$ is elongated, and so, there is an advantage that a margin in time of the input signal DIN for write operation can be broadened.

Now one preferred embodiment of the present invention will be described with reference to FIG. 5. In this figure, component parts equivalent to those shown in FIG. 1 are designated by like reference numerals.

In FIG. 5, a dash-line block 10' represents a data circuit according to the present invention. Transistors $Q_{51}$ to $Q_{58}$ are all N-channel MISFET's. This data circuit 10' comprises a first stage inverter connected to an input terminal DIN and consisting of a depletion type MISFET $Q_{51}$ and an enhancement type MISFET $Q_{52}$, a second stage inverter consisting of a depletion type MISFET $Q_{54}$ and an enhancement type MISFET $Q_{55}$, a third stage inverter consisting of a depletion type MISFET $Q_{57}$ and an enhancement type MISFET $Q_{58}$, a depletion type MISFET $Q_{53}$ connected between an output point $N_{51}$ of the first stage inverter and an input point $N_{52}$ of the second stage inverter and having a signal $\phi_1$ applied to its gate, a depletion type MISFET $Q_{56}$ connected between an output point $N_{53}$ of the second stage inverter and an input point $N_{54}$ of the third stage inverter and having the signal $\phi_1$ applied to its gate, a capacitor $C_{51}$ connected between the input point $N_{52}$ of the second stage inverter and the ground, a capacitor $C_{52}$ connected between the input point $N_{54}$ of the third stage inverter and the ground, and a buffer $A_{51}$ and an inverter $A_{52}$ both conected to an output point $N_{55}$ of the third stage inverter. In this circuit arrangement, the MISFET's $Q_{55}$ and $Q_{56}$ are used as variable resistors which take a high resistance when the signal $\phi_1$ is at a "0" level and take a low resistance when the signal $\phi_1$ is at a "1" level. An inverter $A_{53}$ connected to a write terminal $\overline{WE}$ generates an internal write signal WC for controlling write gates $Q_w$ and $Q_w'$. A delay circuit DC1 includes two stages of inverters $A_{54}$ and $A_{55}$, and it generates the signal $\phi_1$ by delaying the internal write signal WC for a period of $T_1$.

The combination of the MISFET $Q_{53}$ and the capacitor $C_{51}$ and the combination of the MISFET $Q_{56}$ and the capacitor $C_{52}$, respectively, form time constant circuits. This data circuit 10' has a large input-output delay characteristic when the signal $\phi_1$ is at a "0" level, while it has a small input-output delay characteristic when the signal $\phi_1$ is at a "1" level.

Now, the operation of the circuit shown in FIG. 5 will be explained with reference to FIG. 6. At a time point $t_1$ the write signal $\overline{WE}$ changes to a low level and at the same time an input data DIN becomes effective. At this moment, since the signal $\phi_1$ is at a "1" level, the resistances of the MISFET's $Q_{53}$ and $Q_{56}$ are small, that is, as the conductances of these MISFET's $Q_{53}$ and $Q_{56}$ are large, the time constants between the nodes $N_{51}$ and $N_{52}$ and between the nodes $N_{53}$ and $N_{54}$ are small, and hence at a time point $t_2$ when a period $T_R$ has elapsed from the time point $t_1$ true and complementary oututs $D_0$ and $\overline{D_0}$ of the data circuit 10' becomes effective. At a moment $t_3$ when the delay time $T_1$ of the delay circuit DC1 has elapsed from the time point $t_1$, the signal $\phi_1$ changes to a "0" level. Consequently, the resistances of the MISFET's $Q_{53}$ and $Q_{56}$ become large, that is, their conductances become small, and so, the transmission delay time of the data circuit 10' is increased. Hence, though the data DIN changes at a time point $t_4$, the outputs $D_0$ and $\overline{D_0}$ of the data circuit 10' are retained for a period of $T_F$ from this point $t_4$, so that these outputs $D_0$ and $\overline{D_0}$ are still effective until a time point $t_5$ when the address selection is still effective. Accordingly, a write effective period $T_v$ can be substantially enlarged.

Another preferred embodiment of the present invention will be explained with reference to FIG. 7.

In this preferred embodiment, in order to control a transmission characteristic of a data circuit 10", a series circuit of an enhancement type MISFET $Q_{73}$ and a capacitor $C_{71}$ and a series circuit of an enhancement type MISFET $Q_{76}$ and a capacitor $C_{72}$ are respectively connected between an output point $N_{71}$ of a first state inverter consisting of a depletion type MISFET $Q_{71}$ and an enhancement type MISFET $Q_{72}$ and the ground, and between an output point $N_{73}$ of a second stage inverter consisting of a depletion type MISFET $Q_{74}$ and an enhancement type MISFET $Q_{75}$ and the ground, and a signal $\phi_2$ is applied to the gates of the MISFET's $Q_{73}$ and $Q_{76}$, so that a high speed transmission characteristic may be obtained when the signal $\phi_2$ is at a "0" level, whereas the capacitors $C_{71}$ and $C_{72}$ may be respectively added to the nodes $N_{71}$ and $N_{73}$ to enlarge the corresponding time constant and thereby a low speed transmission characteristic may be obtained when the signal $\phi_2$ is at a "1" level. The signal $\phi_2$ is a signal delayed by a period $T_2$ with respect to the write signal WE as shown in FIG. 8, which signal $\phi_2$ is produced by passing the signal WC through an inverter delay circuit $DC_2$ which is composed of inverters $A_{74}$ to $A_{76}$. Accordingly, in the data circuit $10''$, during the delay time $T_2$ from the moment when the data input DIN has become effective, since the signal $\phi_2$ is at a low level, the MISFET's $Q_{73}$ and $Q_{76}$ are not conducting. Hence, the loads at the nodes $N_{71}$ and $N_{73}$ are light, and the input signal transmits quickly to a node $N_{75}$. If a write condition sustains for a long time, then the signal $\phi_2$ becomes a high level, so that the MISFET's $Q_{73}$ and $Q_{76}$ become conducting, and as the load capacitors at the nodes $N_{72}$ and $N_{74}$ are added to the nodes $N_{71}$ and $N_{73}$, respectively, the input signal transmission speed is slowed down and the DIN signal transmits to the node $N_{75}$ slowly. After all, the same result as the preferred embodiment shown in FIG. 5 can be obtained. In this way, according to the illustrated embodiments of the present invention, a margin in time of a signal DIN for write operation can be broadened.

While the present invention has been described above in connection to its preferred embodiments, the circuit arrangement should not be limited to the illustrated embodiments but could be modified according to the situation.

In addition, while description has been made above in connection to circuits employing N-channel MISFET's, the present invention does not exclude application of P-channel MISFET's. Furthermore, if the method shown in FIG. 7 is employed, then it is possible to apply the present invention to a logic circuit employing bipolar transistors or the like.

I claim:

1. A transistor circuit comprising a data line, at least one memory cell coupled to said data line, means for receiving an input signal, a delay circuit having an input terminal coupled to said receiving means, said delay circuit generating a delayed input signal at its output terminal after a controlled amount of delay time has elapsed from the receipt of said input signal, said delay circuit including a variable constant circuit, a time constant of said variable time constant circuit being changed between a first value and a second value in response to a first control signal, means for applying said input signal supplied at said input terminal of said delay circuit to said variable time constant circuit, means for coupling the output of said variable time constant circuit to said output terminal of said delay circuit, and means for transmitting said delayed input signal at said output terminal of said delay circuit to said data line.

2. The circuit according to claim 1, in which said transmitting means includes a buffer circuit coupled to said output terminal of said delay circuit and transfer gate means coupled between said data line and the output terminal of said buffer circuit, said transfer gate means being controlled by a second control signal, and said first control signal is generated by delaying said second control signal.

3. The circuit according to claim 1, in which said variable time constant circuit includes a series circuit of a transistor controlled by said first control signal and a capacitor coupled between said transistor and a constant potential.

4. The circuit according to claim 1 in which said variable time constant circuit includes a variable resistor means whose resistance is controlled by said first control signal.

5. A memory circuit compressing a data line, at least one memory cell, first means for receiving an input signal, second means for receiving a control signal having first and second logic levels, a variable delay circuit having an input terminal coupled to said first means, said delay circuit generating a delayed input signal at its output terminal after a controlled amount of delay time has elapsed from the receipt of said input signal, means for operatively applying said delayed input signal to said data line, first control means for enabling said applying means in response to said first logic level of said control signal, and second control means responsive to said control signal for controlling a delay time of said variable delay circuit between a first value and a second longer value, said second control circuit setting the delay time at said first value when enabling of said applying means is started and at said second value when the enabling of said applying means is terminated.

6. The memory circuit according to claim 5, in which said applying means includes a transfer gate coupled between said data line and said output terminal of said delay circuit.

7. The memory circuit according to claim 5, in which said first control means includes an inverter having an input coupled to said second receiving means, and said second control means includes a delay circuit having an input terminal receiving a signal of said inverter.

* * * * *

UNITED STATES PATENT AND TRADEMARK OFFICE
CERTIFICATE OF CORRECTION

PATENT NO. : 4,573,145
DATED : February 25, 1986
INVENTOR(S) : Ozawa

It is certified that error appears in the above-identified patent and that said Letters Patent is hereby corrected as shown below:

IN THE SPECIFICATION:

Column 3, line 22, change "effectie wrie" to --effective write--.

Column 4, line 39, change "$D_0$ and $D_0$" to --$D_0$ and $\overline{D}_0$--;

line 47, change "$D_0$ and $D_0$" to --$D_0$ and $\overline{D}_0$--;

line 49, change "$D_0$ and $D_0$" to --$D_0$ and $\overline{D}_0$--.

IN THE CLAIMS:

Column 5, line 46, before "constant" insert --time--.

Signed and Sealed this

Fifth Day of August 1986

[SEAL]

Attest:

DONALD J. QUIGG

Attesting Officer

Commissioner of Patents and Trademarks